US010566202B1

(12) United States Patent
Shu et al.

(10) Patent No.: US 10,566,202 B1
(45) Date of Patent: Feb. 18, 2020

(54) GATE STRUCTURES OF FINFET SEMICONDUCTOR DEVICES

(71) Applicant: GLOBALFOUNDRIES INC., Grand Cayman (KY)

(72) Inventors: Jiehui Shu, Clifton Park, NY (US); Hui Zang, Guilderland, NY (US); Hong Yu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/203,623

(22) Filed: Nov. 29, 2018

(51) Int. Cl.
| | |
|---|---|
| *H01L 29/66* | (2006.01) |
| *H01L 21/8234* | (2006.01) |
| *H01L 27/088* | (2006.01) |
| *H01L 21/28* | (2006.01) |
| *H01L 29/06* | (2006.01) |
| *H01L 29/423* | (2006.01) |

(52) U.S. Cl.
CPC ........ *H01L 21/28123* (2013.01); *H01L 21/823431* (2013.01); *H01L 21/823437* (2013.01); *H01L 21/823481* (2013.01); *H01L 27/0886* (2013.01); *H01L 29/0649* (2013.01); *H01L 29/42376* (2013.01); *H01L 29/66545* (2013.01)

(58) Field of Classification Search
CPC ......... H01L 21/28123; H01L 21/42376; H01L 21/76224; H01L 21/823431; H01L 21/823437; H01L 21/823481; H01L 21/823821; H01L 21/845; H01L 27/0886; H01L 27/0924; H01L 27/10826; H01L 27/10879; H01L 27/1211; H01L 29/0649; H01L 29/41791; H01L 29/66545; H01L 29/66795; H01L 29/785
See application file for complete search history.

(56) References Cited

U.S. PATENT DOCUMENTS

| | | | |
|---|---|---|---|
| 9,991,361 | B2 | 6/2018 | Dai et al. |
| 2014/0001564 | A1* | 1/2014 | Song .................. G06F 17/5081 257/369 |
| 2017/0148682 | A1 | 5/2017 | Basker et al. |
| 2017/0243790 | A1 | 8/2017 | Xie et al. |
| 2017/0278712 | A1* | 9/2017 | Nien ................. H01L 21/28123 |
| 2018/0233579 | A1* | 8/2018 | Li ........................ H01L 21/0217 |
| 2019/0164838 | A1* | 5/2019 | Chang ................ H01L 27/0886 |
| 2019/0304971 | A1* | 10/2019 | Hafez ............... H01L 29/66545 |
| 2019/0355832 | A1* | 11/2019 | Shu ................... H01L 29/66545 |

* cited by examiner

*Primary Examiner* — David C Spalla
(74) *Attorney, Agent, or Firm* — David Cain

(57) ABSTRACT

A method of fabricating a semiconductor device is provided, including providing sacrificial gate structures over a plurality of fins. The sacrificial gate structures include a sacrificial first gate structure and a sacrificial second gate structure. A first gate cut process is performed to form a first gate cut opening in the sacrificial first gate structure, and a second gate cut opening in the sacrificial second gate structure. A first dielectric layer is deposited in the first gate cut opening and the second gate cut opening. The first dielectric layer completely fills the first gate cut opening and partially fills the second gate cut opening. The first dielectric layer is removed from the second gate cut opening, and a second gate cut process is performed. A second dielectric layer is deposited in the second gate cut opening to form a gate cut structure.

20 Claims, 7 Drawing Sheets

GATE STRUCTURES OF FINFET SEMICONDUCTOR DEVICES

FIELD OF THE INVENTION

The disclosed subject matter relates generally to semiconductor devices, and more particularly to a method of fabricating gate structures of fin-type field effect transistors (FinFETs) using a gate cut process and the resulting semiconductor device.

BACKGROUND

Transistors are core building blocks for a majority of semiconductor devices. Some semiconductor devices, such as high performance processor devices, can include millions of transistors per device. Increasing transistor density by decreasing transistor size has traditionally been a high priority in the semiconductor industry.

However, with decreasing transistor size, printing of smaller gate geometries has been challenging due to the limitations of photolithography. The printed designs may appear distorted with irregularities, such as rounded edges, that optical proximity correction (OPC) is unable to compensate. Electrical properties of the transistors may be significantly distorted if such distortions are not corrected.

To ensure proper printability, a gate structure is formed and then "cut" using a cut mask to remove unwanted portions of the gate structure. This approach results in the most satisfactory printout of gate structures, and it is noteworthy that this approach applies for formation of different types of transistors, such as planar transistors and FinFETs.

As the gate structures in the transistors can be expected to have different widths, more than one the cut mask may be required to "cut" portions of the gate layer to ensure proper separation of the transistors. The need for multiple cut masks is likely to be costly.

As described above, there is a strong need to present a low cost fabrication method of forming gate structures having different widths using a gate cut process.

SUMMARY

To achieve the foregoing and other aspects of the present disclosure, a method to fabricate gate structures of FinFET semiconductor devices and the resulting semiconductor structure are presented.

According to an aspect of the disclosure, a method of fabricating a semiconductor device is provided, including providing sacrificial gate structures over a plurality of fins. The sacrificial gate structures include a sacrificial first gate structure and a sacrificial second gate structure. A first gate cut process is performed to form a first gate cut opening in the sacrificial first gate structure, and a second gate cut opening in the sacrificial second gate structure. A first dielectric layer is deposited in the first gate cut opening and the second gate cut opening. The first dielectric layer completely fills the first gate cut opening and partially fills the second gate cut opening. The first dielectric layer is removed from the second gate cut opening, and a second gate cut process is performed. A second dielectric layer is deposited in the second gate cut opening to form a gate cut structure.

According to another aspect of the disclosure, a semiconductor device is provided, including a first gate structure, a second gate structure, a third gate structure, a fourth gate structure, a first gate cut structure and a second gate cut structure. The first gate cut structure is positioned between the first and second gate structures, and the first gate cut structure includes a first dielectric material and a second dielectric material. The second gate cut structure is positioned between the third and fourth gate structures, and the second gate cut structure includes the second dielectric material and has a width wider than the first gate cut structure.

BRIEF DESCRIPTION OF THE DRAWINGS

The embodiments of the present disclosure will be better understood from a reading of the following detailed description, taken in conjunction with the accompanying drawings.

Figure 1:
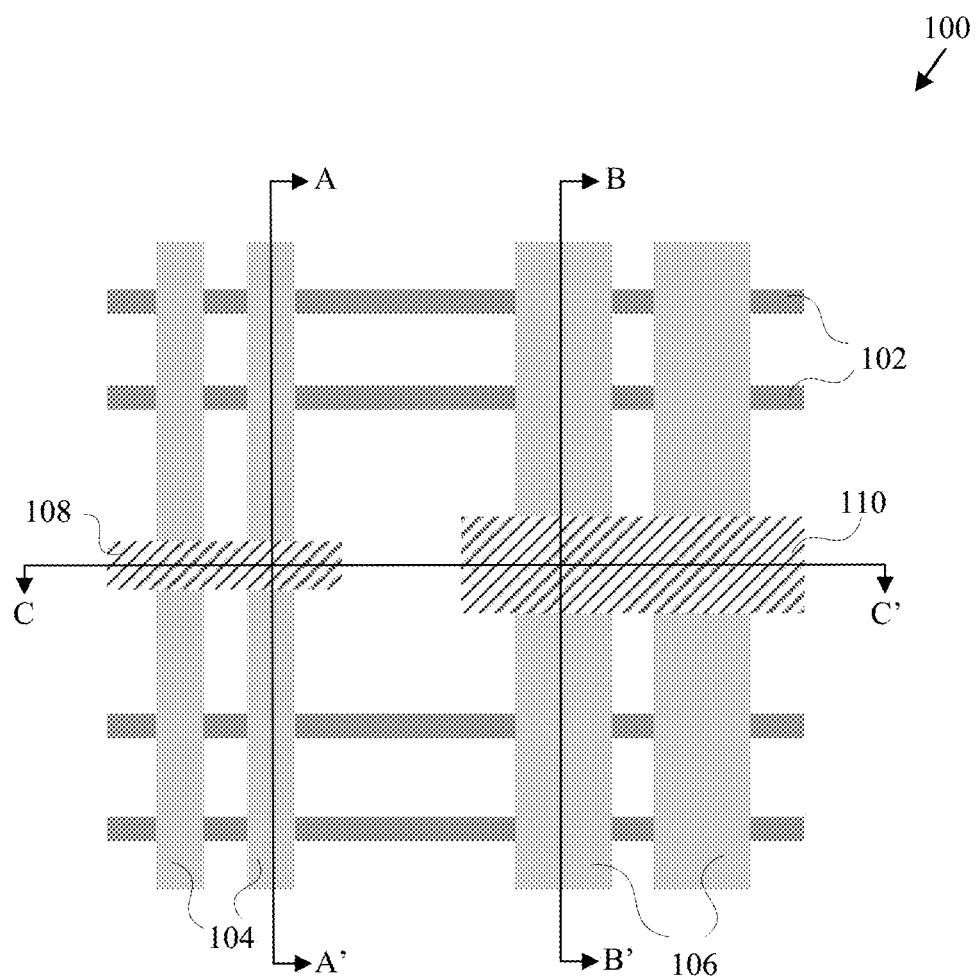
FIG. 1 is a top view of a FinFET device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure. Additionally, elements in the drawings are not necessarily drawn to scale. For example, the dimensions of some of the elements in the drawings may be exaggerated relative to other elements to help improve understanding of embodiments of the disclosure. The same reference numerals in different drawings denote the same elements, while similar reference numerals may, but do not necessarily, denote similar elements.

DETAILED DESCRIPTION

The following detailed description is exemplary in nature and is not intended to limit the devices, the methods or the applications and uses of the devices. Furthermore, there is no intention to be bound by any theory presented in the preceding background of the device or the following detailed description.

Typically, an array of gate structures is formed over fin structures to define various FinFET devices. Subsequently a gate cut process is performed to cut the gate structures in the cross direction to separate the FinFET devices. Although not shown in the drawings, the portions of the fins in source/drain regions may have additional epitaxial semiconductor material formed thereon in either a merged or unmerged condition.

Aspects of the disclosure are now described in detail with accompanying drawings. It is noted that like and corresponding elements are referred to by the use of the same reference numerals.

FIG. 1 is a simplified top view of a FinFET device 100, according to an embodiment of the disclosure. The FinFET device 100 includes four fins 102, two sacrificial short gate structures 104, two sacrificial long gate structures 106, a first gate cut structure 108 and a second gate cut structure 110. As used herein, the term "short gate structure" refers to a gate structure having a gate width in a range of 15 to 30 nm, and the term "long gate structure" refers to a gate structure having a gate width in a range of 30 to 200 nm. In one embodiment of the disclosure, the sacrificial short gate structures 104 and the sacrificial long gate structures 106 are formed of amorphous silicon material.

As shown in FIG. 1, the two sacrificial short gate structures 104 and two sacrificial long gate structures 106 are formed over the four fins 102. The first gate cut structure 108 is formed across a short axis of the sacrificial short gate structures 104 and the second gate cut structure 110 is formed across a short axis of the sacrificial long gate structures 106. The first gate cut structure 108 is having a smaller width than the second gate cut structure 110. It should be understood that the number and placement locations of the fins 102, sacrificial gate structures (104 and 106) and their respective gate cut structures (108 and 110) may vary according to the specific design of each FinFET device.

FIGS. 2A-7C are cross-sectional views of a FinFET device 200 (taken along lines A-A', B-B' and C-C' as indicated in FIG. 1), illustrating a method of fabricating gate structures of FinFET devices, according to an embodiment of the disclosure. More specifically, the line A-A' is taken along a long axis of the sacrificial short gate structure 104, the line B-B' is taken along a long axis of the sacrificial long gate structure 106, and the line C-C' is taken in a direction perpendicular to the sacrificial short gate structure 104 and the sacrificial long gate structure 106, and parallel to a long axis of the fins 102 in a region that is to be cut using a gate cut process.

Figure 2A:
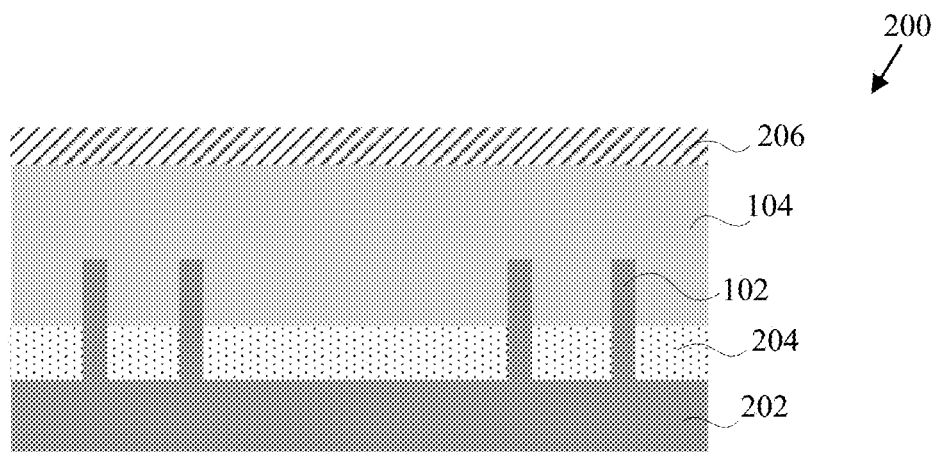
FIGS. 2A-7C are cross-sectional views of a FinFET device (taken along lines A-A', B-B' and C-C' as indicated in FIG. 1), depicting a method of fabricating gate structures using a gate cut process, according to an embodiment of the disclosure.

As illustrated in FIG. 2A (taken along the line A-A' as indicated in FIG. 1), the FinFET device 200 includes a semiconductor substrate 202, the plurality of fins 102 over the substrate 202, a first dielectric layer 204 over the substrate 202 and between lower portions of the fins 102, the sacrificial short gate structure 104 over the first dielectric layer 204 embedding upper portions of the fins 102 and a hard mask layer 206 over the sacrificial short gate structure 104. The first dielectric layer 204 serves as an isolation layer to isolate the sacrificial short gate structure 104 from the semiconductor substrate 202.

Figure 2B:
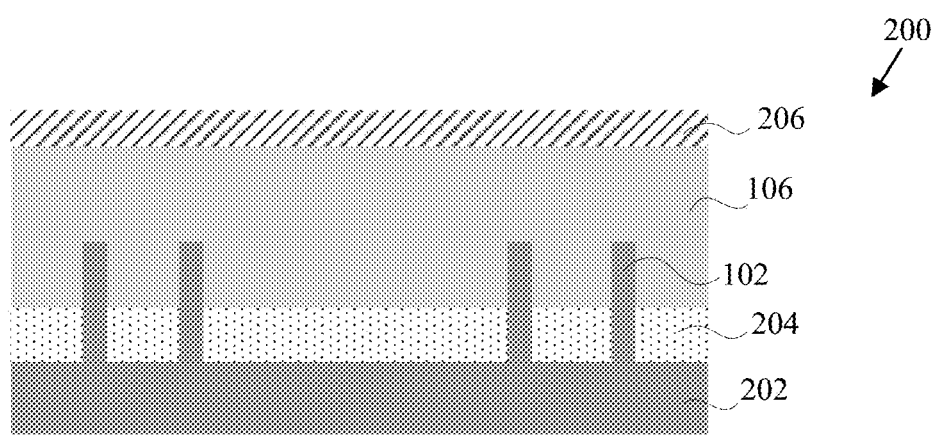

FIG. 2B (taken along the line B-B' as indicated in FIG. 1) illustrates the sacrificial long gate structure 106 over the first dielectric layer 204 embedding the upper portions of the fins 102, and is isolated from the semiconductor substrate 202 by the first dielectric layer 204.

The semiconductor substrate 202 may include of any appropriate semiconductor material, such as silicon, silicon/germanium, silicon/carbon, other II-VI or III-V semiconductor compounds and the like. Thus, the terms "substrate" or "semiconductor substrate" should be understood to cover all typically used semiconducting materials and all forms of such materials.

Figure 2C:
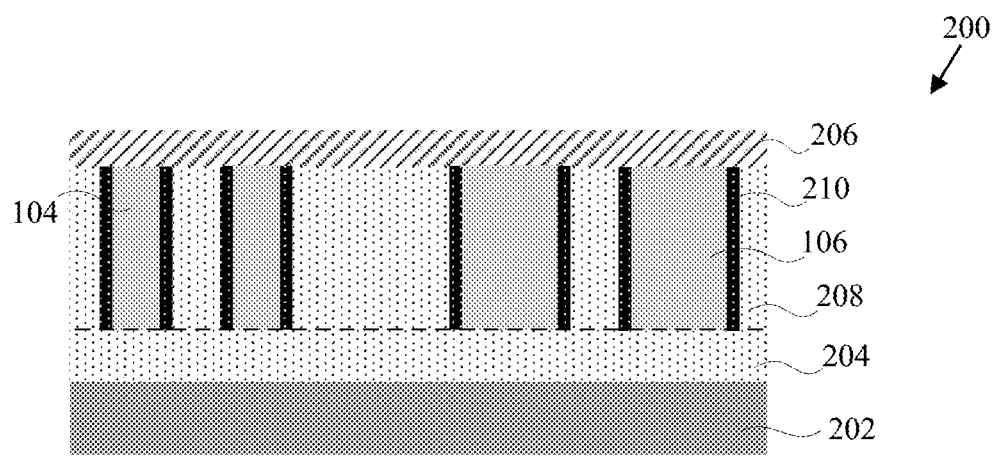

As illustrated in FIG. 2C (taken along the line C-C' as indicated in FIG. 1), the sacrificial short gate structures 104 and the sacrificial long gate structures 106 are interposed in a second dielectric layer 208. The second dielectric layer 208 is formed over the first dielectric layer 204. Specifically in FIG. 2C, the second dielectric layer 208 is formed of the same dielectric material as the first dielectric layer 204. The second dielectric layer 208 may also be formed from a different dielectric material as the first dielectric layer 204. Sidewalls of the sacrificial short gate structures 104 and sidewalls of the sacrificial long gate structures 106 are lined with spacers 210. In one embodiment of the disclosure, the material used to form the spacer 210 is preferably a low-k dielectric material, i.e., a dielectric material having a low dielectric constant. In another embodiment of the disclosure, the dielectric material used to form the spacer 210 is preferred to be silicon nitride (SiN), silicon oxynitride (SiON), silicon carbonitride (SiCN), silicon carbide (SiC), silicon oxycarbide (SiOC) or boron-doped silicon carbonitride (SiBCN). In yet another embodiment of the disclosure, the spacer 210 has a width in a range of 2 to 10 nm.

Figure 3A:
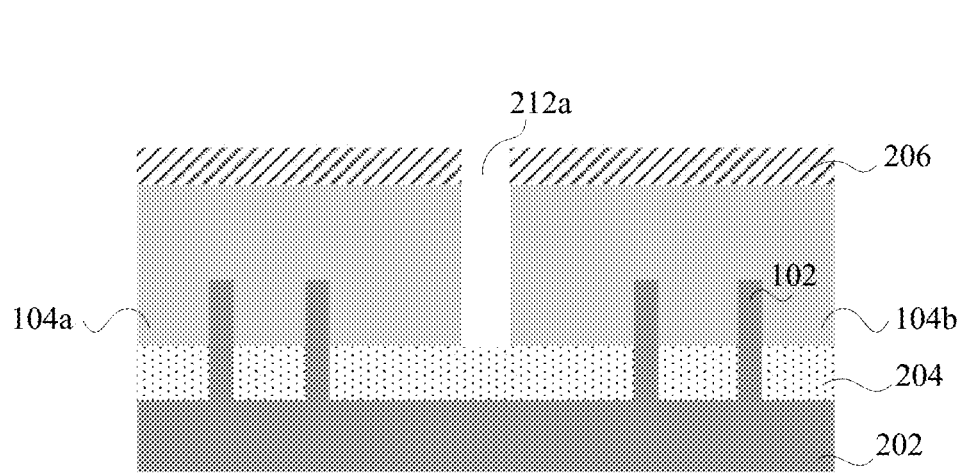
Figure 3B:
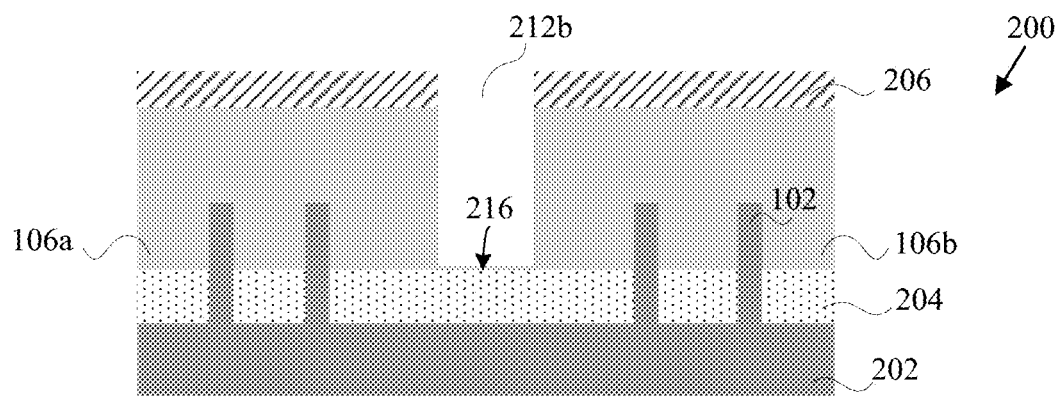
Figure 3C:
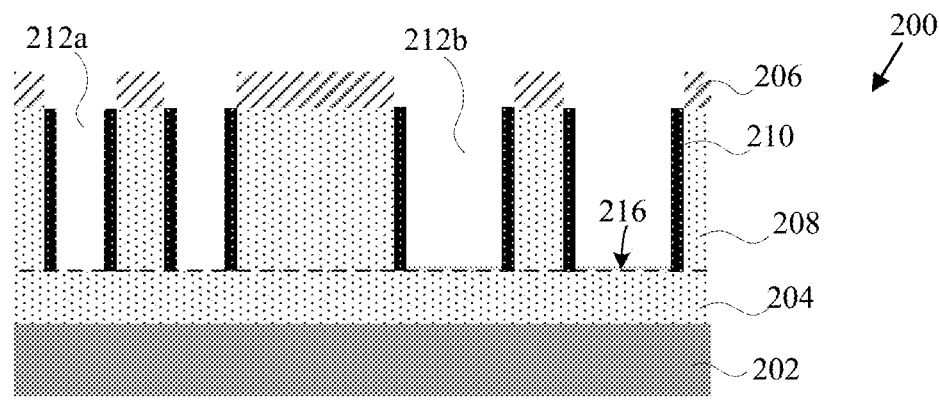

FIGS. 3A, 3B and 3C are cross-sectional views of the FinFET device 200 after forming gate cut openings 212a and 212b in the sacrificial gate structures 104 and 106 respectively. Portions of the sacrificial gate structure material are removed using a suitable gate cut process, such as reactive ion etch (RIE) process. The gate cut opening 212a is formed across the short axis of the sacrificial short gate structure 104. The sacrificial short gate structure 104 has been divided into two segments, 104a and 104b, by the gate cut opening 212a, as illustrated in FIG. 3A. The gate cut opening 212b is formed across the short axis of the sacrificial long gate structure 106. The sacrificial long gate structure 106 has also been divided into two segments, 106a and 106b, by the gate cut opening 212b, as illustrated in FIG. 3B. In one embodiment of the disclosure, the gate cut opening 212b has a wider width than the gate cut opening 212a. In another embodiment of the disclosure, the gate cut opening 212a has a width in a range of 15 to 50 nm. In yet another embodiment of the disclosure, the gate cut opening 212b has a width in a range of 50 to 250 nm.

The hard mask layer 206 and the sacrificial gate structures 104 and 106 exhibit high etch selectivity to the spacers 210, and the spacers 210 are left relatively undamaged after the gate cut process. As the gate cut openings 212a and 212b are formed simultaneously, all the sacrificial gate material from the smaller gate cut openings 212a has been removed, whereas presence of sacrificial gate material residue at bottom surfaces 216 of the larger gate opening 212b may be expected. The presence of such residue may provide an undesirable conductive path and short neighboring FinFET devices. Extending the gate cut process to clear the sacrificial gate material residue is not recommended, as additional processing may increase the width of the gate cut opening 212a beneath the hard mask layer 206.

Figure 4A:
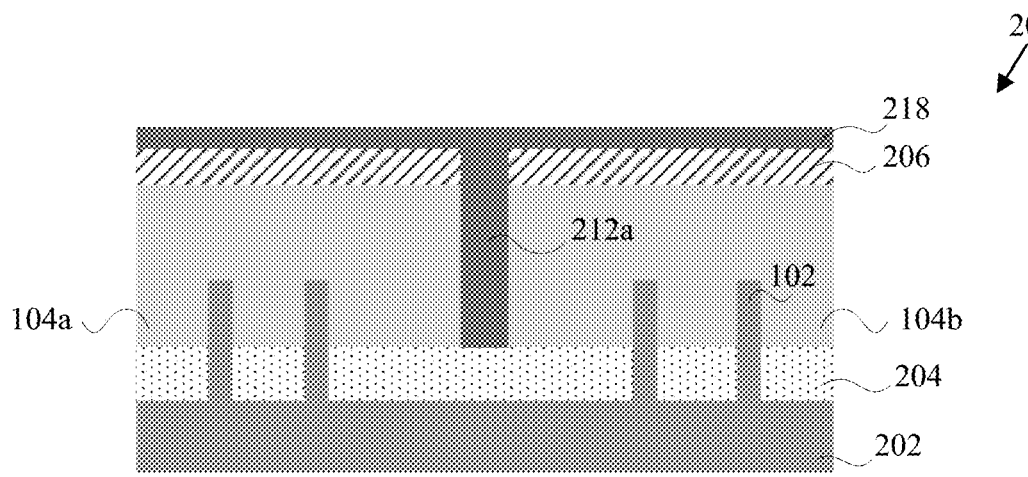
Figure 4B:
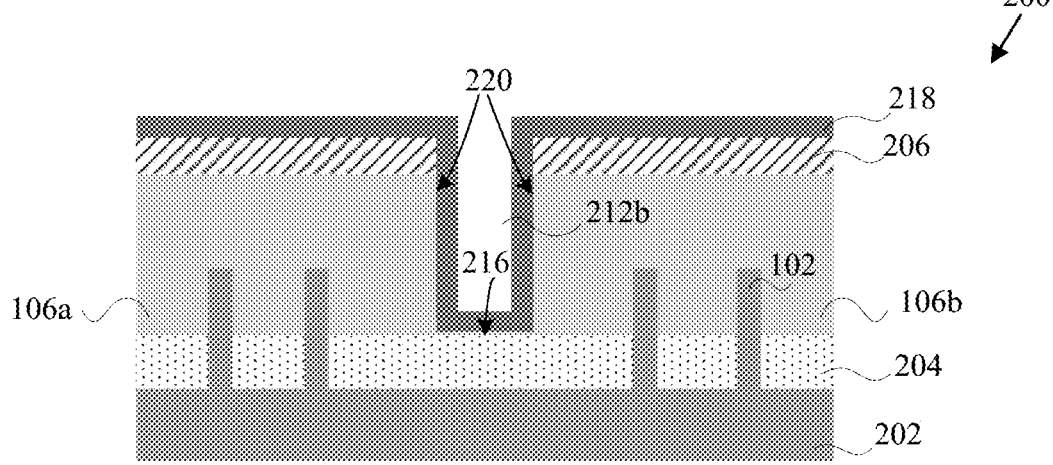
Figure 4C:
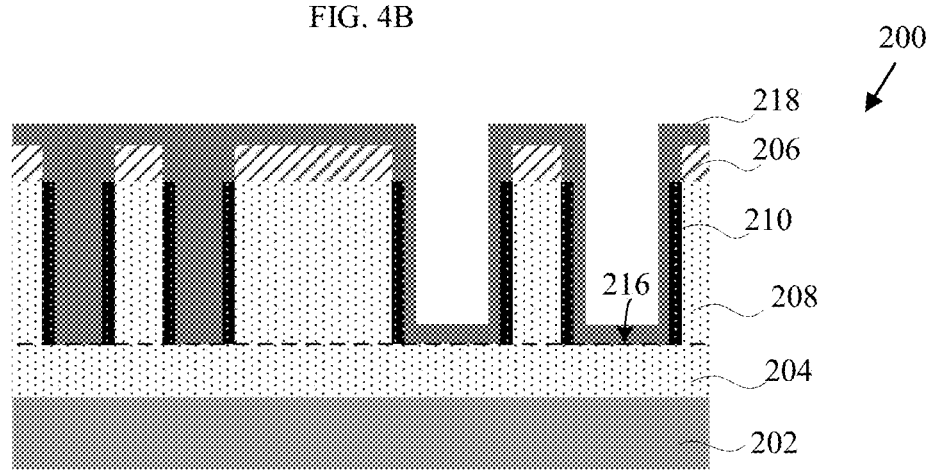

FIGS. 4A, 4B and 4C are cross-sectional views of the FinFET device 200 after depositing a third dielectric material 218. The third dielectric material 218 overfills the gate cut opening 212a, and partially fills the gate cut opening 212b due to the wider width of gate cut opening 212b. A highly conformal deposition process is preferred for depositing the third dielectric material 218; for example, atomic layer deposition (ALD) process or highly-controlled chemical-vapor deposition (CVD) process. The third dielectric material 218 is deposited conformally in the gate cut opening 212b, covering the bottom surfaces 216 and sidewalls 220 of the gate cut opening 212b, as illustrated in FIG. 4B. In an event a non-conformal deposition process is employed, the potential presence of a "pinch-off" at upper portions of the gate cut opening 212b may be expected to form an undesirable void in the gate cut opening 212b.

In one embodiment of the disclosure, the third dielectric material 218 is preferred to be a low-k dielectric material. The low-k dielectric material in the gate cut opening 212a enables capacitance in the gate cut opening 212a to be kept low. In another embodiment of the disclosure, the third dielectric material 218 includes silicon nitride (SiN), silicon oxynitride (SiON), silicon carbonitride (SiCN), silicon carbide (SiC), silicon oxycarbide (SiOC) or boron-doped silicon carbonitride (SiBCN), and may or may not be the same dielectric material as the spacers 210.

Figure 5A:
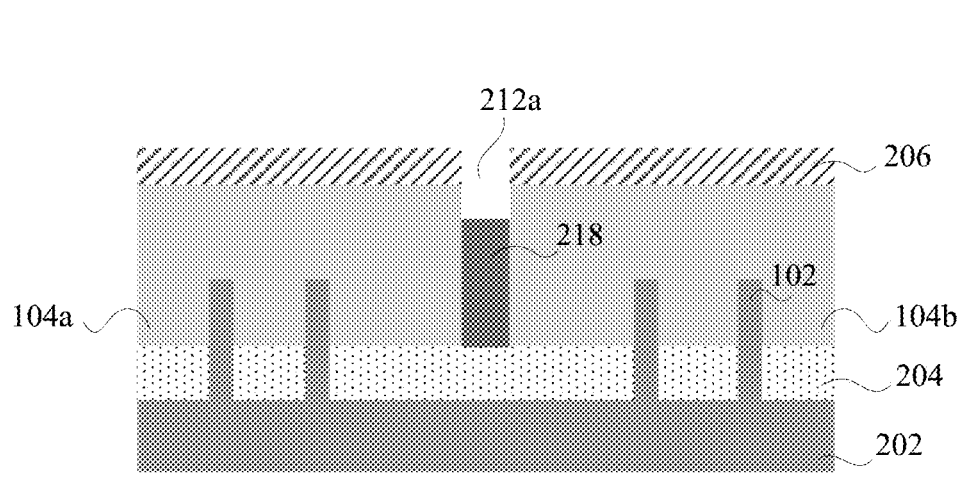
Figure 5B:
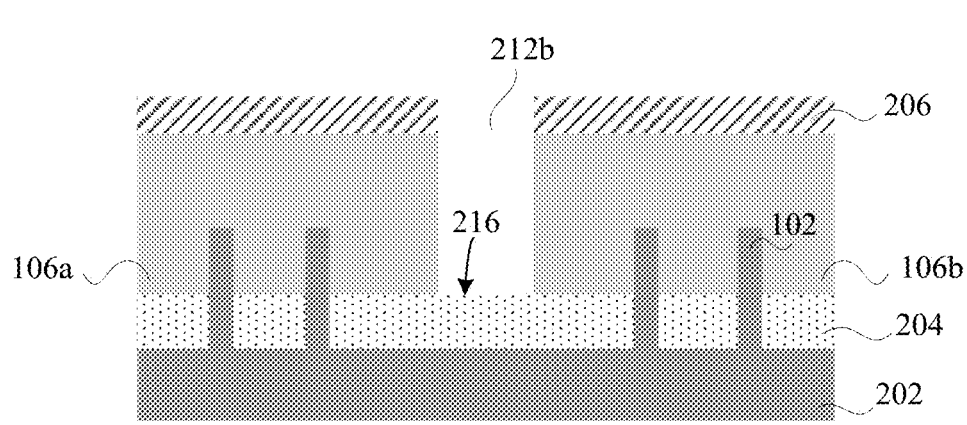
Figure 5C:
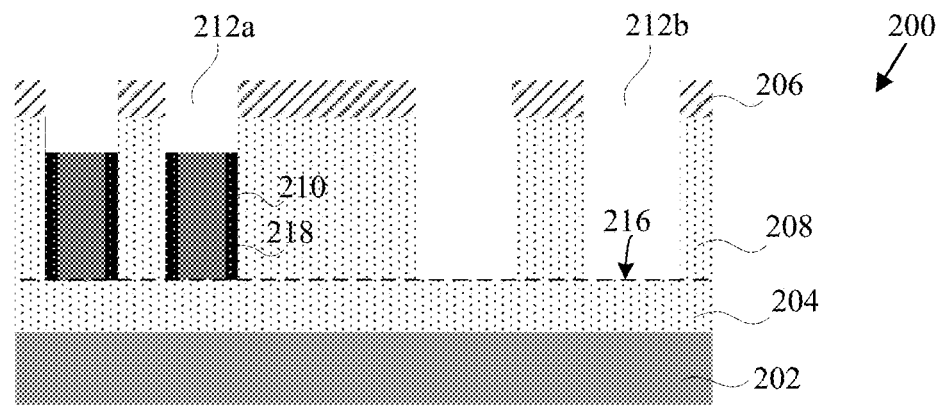

FIGS. 5A, 5B and 5C are cross-sectional views of the FinFET structure 200 after removing the third dielectric material 218 in the gate cut opening 212b. A suitable material removing process is employed, such as an isotropic RIE process. The amount of third dielectric material 218 removed from the gate cut opening 212b recesses the third dielectric material 218 in the gate cut opening 212a by the same amount. The remaining third dielectric material 218 in the gate cut opening 212a is recessed below the hard mask layer 206, as illustrated in FIG. 5A. As the spacer 210 and the third dielectric material 218 have similar material properties, the spacer 210 and the third dielectric material 218 are removed concurrently during the material removing process, as illustrated in FIG. 5C. In one embodiment of the disclosure, the amount of third dielectric material 218 recessed in the gate cut opening 212a is in a range of 10 to 40 nm, with a preferred recessed depth of 20 nm.

An additional gate cut process is performed to remove the sacrificial gate material residue at the bottom surfaces 216 of the gate cut opening 212b. The gate cut opening 212a is protected by the remaining spacer 210 and the third dielectric material 218 during the additional gate cut process, without using additional photolithography mask to protect the gate cut opening 212a.

Figure 6A:
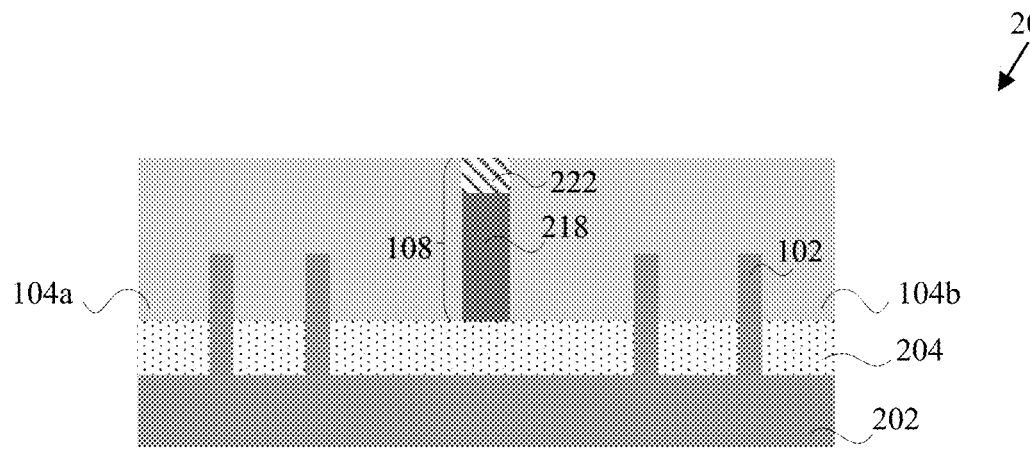
Figure 6B:
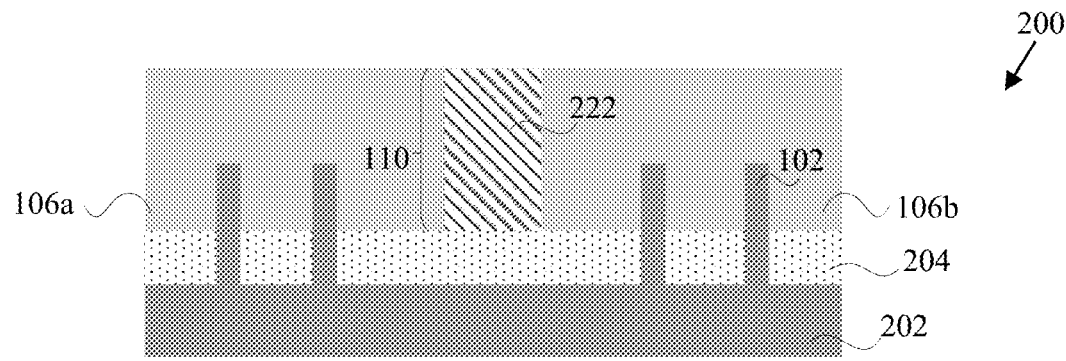
Figure 6C:
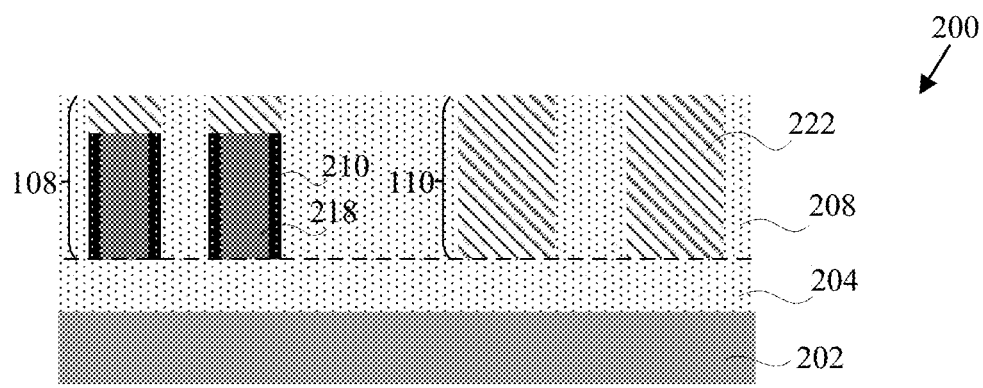

FIGS. 6A, 6B and 6C are cross-sectional views of the FinFET structure 200 after depositing a fourth dielectric material 222. The fourth dielectric material 222 fills the gate cut opening 212a over the third dielectric material 218 and forms the first gate cut structure 108, as illustrated in FIG. 6A. The fourth dielectric material 222 also fills the gate cut opening 212b to form the second gate cut structure 110, as illustrated in FIG. 6B. In one embodiment of the disclosure, materials at top portions of the gate cut structures are preferred to be the same to eliminate potential process selectivity issues for downstream processes. In another embodiment of the disclosure, the fourth dielectric material 222 has a higher k-value than the third dielectric material 218. In yet another embodiment of the disclosure, the fourth dielectric material 222 is SiN.

A planarization process is performed after the deposition of the fourth dielectric material 222 to expose the sacrificial short gate structure 104 and the sacrificial long gate structure 106. The hard mask layer 206 is removed in the same planarization process.

Figure 7A:
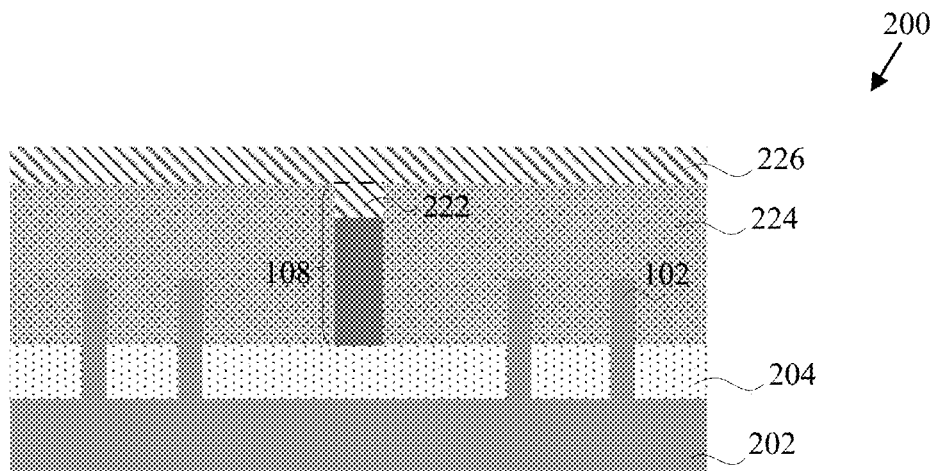
Figure 7B:
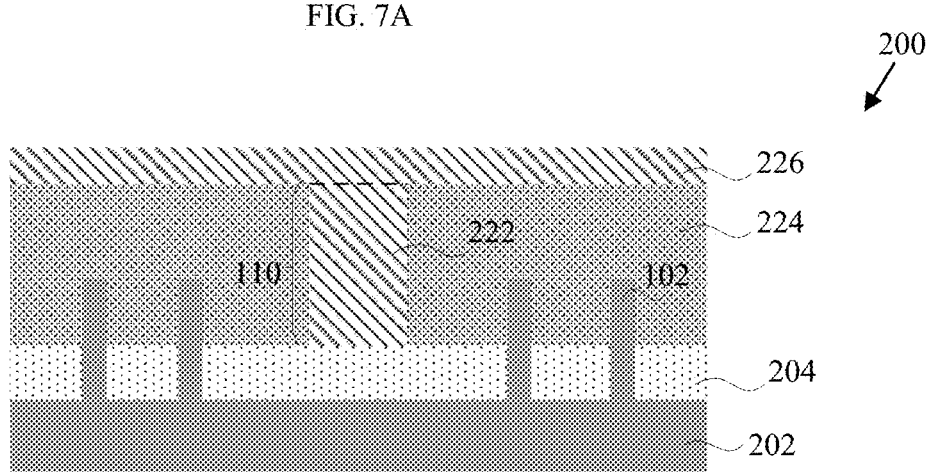
Figure 7C:
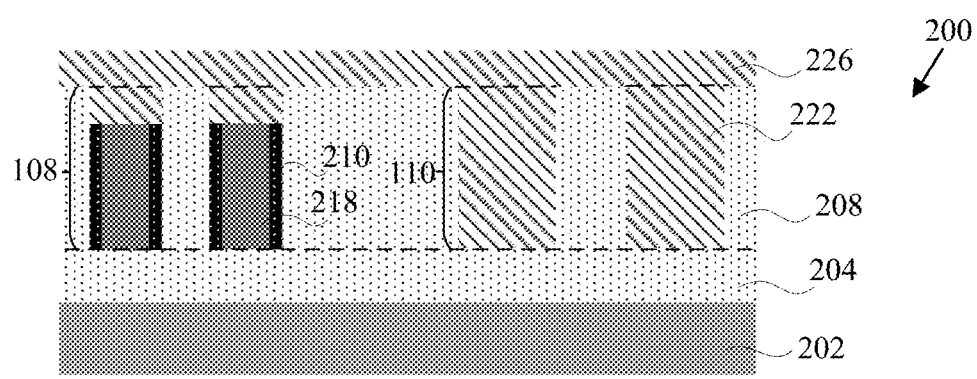

FIGS. 7A, 7B and 7C are cross-sectional views of the FinFET structure 200 after a plurality of processes to form gate structure 224. The processes may include one or more deposition processes to form a gate insulation layer (e.g., silicon dioxide, hafnium oxide or a high-k material) and one or more conductive layers (e.g., barrier layers, seed layers, work function material layers and fill layers) that will be part of a gate electrode of the gate structure 224 (layers are not separately shown). A capping layer 226 is deposited over the gate structure 224, and in one embodiment of the disclosure, the capping material 226 comprises SiN.

In the above detailed description, a method of fabricating gate structures of FinFET devices using a gate cut process without additional photolithographic mask is presented. By employing a conformal deposition process to deposit a dielectric material in the gate cut openings of different widths, the dielectric material remaining in the smaller gate cut openings will protect it from an additional gate cut process to remove sacrificial gate material residue that is potentially present in the larger gate cut openings. The remaining dielectric material may be left in the smaller gate cut openings as part of the gate cut structure to separate the FinFET devices.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A method of fabricating a semiconductor device comprising:
   providing sacrificial gate structures over a plurality of fins, wherein the sacrificial gate structures comprise a sacrificial first gate structure and a sacrificial second gate structure;
   performing a first gate cut process to form gate cut openings, wherein a first gate cut opening is formed in the sacrificial first gate structure and a second gate cut opening is formed in the sacrificial second gate structure;
   depositing a first dielectric layer in the gate cut openings, wherein the first dielectric layer fills the first gate cut opening and partially fills the second gate cut opening;
   removing the first dielectric layer in the second gate cut opening;
   performing a second gate cut process in the second gate cut opening; and
   depositing a second dielectric layer in the second gate cut opening to form a gate cut structure.

2. The method of claim 1, wherein the second gate cut opening comprises sidewalls and a bottom surface, the first dielectric layer is conformally deposited in the second gate cut opening, covering the sidewalls and the bottom surface of the second gate cut opening.

3. The method of claim 1, wherein the gate cut structure is a second gate cut structure, further comprises:

recessing the first dielectric layer in the first gate cut opening during the removal of the first dielectric layer in the second gate cut opening; and depositing the second dielectric layer in the recessed portion of the first gate cut opening, wherein the first dielectric layer and the second dielectric layer form a first gate cut structure.

4. The method of claim 3 wherein the recessed first dielectric layer in the first gate cut opening has a depth in a range of 10 to 40 nm below the sacrificial first gate structure.

5. The method of claim 1 wherein the sacrificial gate structures comprise amorphous silicon.

6. The method of claim 1 wherein the first and second gate cut processes performed is a reactive ion etch process.

7. The method of claim 1 wherein the formed first gate cut opening has a width in a range of 15 to 50 nm.

8. The method of claim 1 wherein the formed second gate cut opening has a width in a range of 50 to 250 nm.

9. The method of claim 1 wherein the deposited first dielectric layer is deposited using atomic layer deposition process or a conformal chemical vapor deposition process.

10. The method of claim 1 wherein the deposited first dielectric layer comprises silicon nitride, silicon oxynitride, silicon carbonitride, silicon carbide, silicon oxycarbide or boron-doped silicon carbonitride.

11. A semiconductor device comprising:
a first gate structure;
a second gate structure;
a third gate structure;
a fourth gate structure;
a first gate cut structure between the first gate structure and the second gate structure, wherein the first gate cut structure comprises a first dielectric material and a second dielectric material over the first dielectric layer; and a second gate cut structure between the third gate structure and the fourth gate structure, wherein the second gate cut structure comprises the second dielectric material and has a width wider than the first gate cut structure.

12. The semiconductor device of claim 11 wherein the first gate cut structure has a width in a range of 15 to 50 nm.

13. The semiconductor device of claim 11 wherein the second gate cut structure has a width in a range of 50 to 250 nm.

14. The semiconductor device of claim 11, wherein the second dielectric material has a height in a range of 10 to 40 nm over the first dielectric material in the first gate cut structure.

15. The semiconductor device of claim 11, wherein the first dielectric material is having a lower dielectric constant value than the second dielectric material.

16. The semiconductor device of claim 11, wherein the first dielectric material comprises silicon nitride, silicon oxynitride, silicon carbonitride, silicon carbide, silicon oxycarbide or boron-doped silicon carbonitride.

17. The semiconductor device of claim 11, wherein the second dielectric material comprises silicon nitride.

18. The semiconductor device of claim 11, wherein the first and second gate structures have a width in a range of 15 to 30 nm.

19. The semiconductor device of claim 11, wherein the second gate cut structure comprises the second dielectric material.

20. The semiconductor device of claim 11, wherein the third and fourth gate structures has a width in a range of 30 to 200 nm.

\* \* \* \* \*